US009677749B2

(12) United States Patent
Chen

(10) Patent No.: US 9,677,749 B2
(45) Date of Patent: Jun. 13, 2017

(54) CONFORMAL POWER ADAPTER FOR LIGHTED ARTIFICIAL TREE

(71) Applicant: Willis Electric Co., Ltd., Taipei (TW)

(72) Inventor: Johnny Chen, Taipei (TW)

(73) Assignee: Willis Electric Co., Ltd., Taipei (TW)

( * ) Notice: Subject to any disclaimer, the term of this patent is extended or adjusted under 35 U.S.C. 154(b) by 0 days.

(21) Appl. No.: 14/970,118

(22) Filed: Dec. 15, 2015

(65) Prior Publication Data

US 2016/0169493 A1  Jun. 16, 2016

Related U.S. Application Data

(63) Continuation of application No. 14/064,650, filed on Oct. 28, 2013, now Pat. No. 9,222,656, which is a
(Continued)

(51) Int. Cl.
*F21S 4/00* (2016.01)
*H05B 37/00* (2006.01)
(Continued)

(52) U.S. Cl.
CPC ............ *F21V 23/009* (2013.01); *A47G 33/06* (2013.01); *F21S 4/10* (2016.01); *F21V 23/004* (2013.01);
(Continued)

(58) Field of Classification Search
None
See application file for complete search history.

(56) References Cited

U.S. PATENT DOCUMENTS

| 438,310 A | 10/1890 | Edison |
|---|---|---|
| 735,010 A | 7/1903 | Zahl |

(Continued)

FOREIGN PATENT DOCUMENTS

| CA | 1182513 A | 2/1985 |
|---|---|---|
| CN | 2102058 U | 4/1992 |

(Continued)

OTHER PUBLICATIONS

Petition for Inter Partes Review, Case IPR2016-00802, U.S. Pat. No. 9,044,056, dated Apr. 28, 2016 (73 pgs.).
(Continued)

*Primary Examiner* — Anh Tran
(74) *Attorney, Agent, or Firm* — Christensen, Fonder, Dardi & Herbert PLLC

(57) ABSTRACT

A conformal power adapter for insertion into a lighted artificial tree and for converting power received from an external power source to a power usable by the lighted artificial tree. The power adapter includes an elongated housing including a first end, and a second end; a printed circuit board assembly including power-converting circuitry for converting an input electrical power to an output electrical power for use by a lighted artificial tree having a hollow trunk section, the printed circuit board assembly located substantially within the elongated housing; a power cord secured to the first end of the housing and in electrical connection with the power converting electronics, the power cord adapted to transmit power from an external power source to the power-converting circuitry. The elongated housing enclosing the printed circuit board assembly is sized to fit substantially within the hollow trunk portion of the lighted artificial tree.

19 Claims, 5 Drawing Sheets

Related U.S. Application Data continuation of application No. 13/295,842, filed on Nov. 14, 2011, now Pat. No. 8,569,960.

(51) Int. Cl.

| | | |
|---|---|---|
| *H05B 39/00* | (2006.01) | |
| *H05B 41/00* | (2006.01) | |
| *F21V 23/00* | (2015.01) | |
| *A47G 33/06* | (2006.01) | |
| *F21V 33/00* | (2006.01) | |
| *H05K 7/06* | (2006.01) | |
| *F21S 4/10* | (2016.01) | |
| *F21V 23/02* | (2006.01) | |
| *F21V 23/06* | (2006.01) | |
| *F21Y 101/00* | (2016.01) | |
| *F21Y 115/10* | (2016.01) | |

(52) U.S. Cl.
CPC .............. *F21V 23/02* (2013.01); *F21V 23/06* (2013.01); *F21V 33/0028* (2013.01); *H05K 7/06* (2013.01); *F21Y 2101/00* (2013.01); *F21Y 2115/10* (2016.08); *Y10T 29/49117* (2015.01)

(56) References Cited

U.S. PATENT DOCUMENTS

| | | |
|---|---|---|
| 860,406 A | 7/1907 | McGahan |
| 1,314,008 A | 8/1919 | McWilliams |
| 1,372,777 A | 3/1921 | Samuel et al. |
| 1,495,695 A | 5/1924 | Karr |
| 1,536,332 A | 5/1925 | Dam |
| 1,656,148 A | 1/1928 | Harris |
| 1,677,972 A | 7/1928 | Marks |
| 1,895,656 A | 1/1933 | Gadke |
| 1,974,472 A | 9/1934 | Seghers |
| 2,025,189 A | 12/1935 | Yanchenko |
| 2,050,364 A | 8/1936 | Morton |
| 2,072,337 A | 3/1937 | Kamm |
| 2,112,281 A | 3/1938 | Ferris |
| 2,186,351 A | 1/1940 | Stojaneck |
| 2,188,529 A | 1/1940 | Corina |
| 2,229,211 A | 1/1941 | Korengold |
| 2,466,499 A | 4/1949 | Sokolik |
| 2,484,596 A | 10/1949 | Waltz |
| 2,533,374 A | 12/1950 | Hyland |
| 2,563,713 A | 8/1951 | Frei et al. |
| 2,570,751 A | 10/1951 | Benander |
| 2,636,069 A | 4/1953 | Gilbert |
| 2,782,296 A | 2/1957 | Walter |
| 2,806,938 A | 9/1957 | Henry |
| 2,857,506 A | 10/1958 | Minteer |
| 2,863,037 A | 12/1958 | Johnstone |
| 2,932,811 A | 4/1960 | Abraham et al. |
| 2,969,456 A | 1/1961 | Raymaley |
| 2,973,546 A | 3/1961 | Roche |
| 2,984,813 A | 5/1961 | Bossi |
| 3,107,966 A | 10/1963 | Bonhomme |
| 3,115,435 A | 12/1963 | Abramson |
| 3,118,617 A | 1/1964 | Hellrich |
| 3,120,351 A | 2/1964 | Kirsten |
| 3,131,112 A | 4/1964 | Abramson |
| 3,214,579 A | 10/1965 | Pacini |
| 3,233,207 A | 2/1966 | Ahroni et al. |
| 3,286,088 A | 11/1966 | Ahroni |
| 3,296,430 A | 1/1967 | Eckert |
| 3,345,482 A | 10/1967 | Lou |
| 3,398,260 A | 8/1968 | Martens |
| 3,409,867 A | 11/1968 | Lessner |
| 3,470,527 A | 9/1969 | Bonhomme |
| 3,504,169 A | 3/1970 | Freeburger |
| 3,521,216 A | 7/1970 | Tolegian |
| 3,522,579 A | 8/1970 | Matsuya |
| 3,571,586 A | 3/1971 | Duckworth |
| 3,574,102 A | 4/1971 | Hermanson |
| 3,585,564 A | 6/1971 | Skjervoll |
| 3,594,260 A | 7/1971 | Dieffenbach |
| 3,603,780 A | 9/1971 | Lu |
| 3,616,107 A | 10/1971 | Kershner |
| 3,617,732 A | 11/1971 | Fisher |
| 3,640,496 A | 2/1972 | Duncan |
| 3,663,924 A | 5/1972 | Gerlat |
| 3,704,366 A | 11/1972 | Korb et al. |
| 3,715,708 A | 2/1973 | Lloyd et al. |
| 3,728,787 A | 4/1973 | McDonough |
| 3,764,862 A | 10/1973 | Jankowski |
| 3,783,437 A | 1/1974 | Graff et al. |
| 3,806,399 A | 4/1974 | Cocjin |
| 3,812,380 A | 5/1974 | Davis, Jr. |
| 3,819,459 A | 6/1974 | Wren |
| 3,914,786 A | 10/1975 | Grossi |
| 3,970,834 A | 7/1976 | Smith |
| 3,971,619 A | 7/1976 | Rohrssen |
| 3,985,924 A | 10/1976 | Pritza |
| 4,012,631 A | 3/1977 | Creager |
| 4,020,201 A | 4/1977 | Miller |
| 4,045,868 A | 9/1977 | Ammon et al. |
| 4,072,857 A | 2/1978 | DeVicaris |
| 4,097,917 A | 6/1978 | McCaslin |
| 4,109,345 A | 8/1978 | Sargent et al. |
| 4,140,823 A | 2/1979 | Weskamp |
| 4,161,768 A | 7/1979 | Gauthier et al. |
| 4,245,875 A | 1/1981 | Shaffer et al. |
| 4,248,916 A | 2/1981 | Chase |
| 4,273,814 A | 6/1981 | Koehler |
| 4,291,075 A | 9/1981 | Puleo |
| 4,340,841 A | 7/1982 | Schupp |
| 4,343,842 A | 8/1982 | Chase |
| 4,437,782 A | 3/1984 | Geisthoff |
| 4,447,279 A | 5/1984 | Boisvert et al. |
| 4,451,510 A | 5/1984 | Boisvert et al. |
| 4,462,065 A | 7/1984 | Rhodes |
| 4,493,523 A | 1/1985 | Leong et al. |
| 4,496,615 A | 1/1985 | Huang |
| 4,516,193 A | 5/1985 | Murphy |
| 4,519,666 A | 5/1985 | Williams et al. |
| 4,546,041 A | 10/1985 | Keane et al. |
| 4,573,102 A | 2/1986 | Norwood |
| 4,620,270 A | 10/1986 | Laasko |
| 4,631,650 A | 12/1986 | Ahroni |
| 4,659,597 A | 4/1987 | Lau |
| 4,675,575 A | 6/1987 | Smith et al. |
| 4,712,299 A | 12/1987 | Loewen et al. |
| 4,720,272 A | 1/1988 | Durand |
| 4,727,449 A | 2/1988 | Fleck |
| 4,753,600 A | 6/1988 | Williams |
| 4,759,729 A | 7/1988 | Kemppainen et al. |
| 4,769,579 A | 9/1988 | Jou |
| 4,772,215 A | 9/1988 | Falk |
| 4,775,922 A | 10/1988 | Engel |
| 4,777,573 A | 10/1988 | Liao |
| 4,779,177 A | 10/1988 | Ahroni |
| 4,789,570 A | 12/1988 | Maddock |
| 4,799,902 A | 1/1989 | Laudig et al. |
| 4,805,075 A | 2/1989 | Damore |
| 4,807,098 A | 2/1989 | Ahroni |
| 4,808,885 A | 2/1989 | Bausch et al. |
| 4,855,880 A | 8/1989 | Mancusi, Jr. |
| 4,859,205 A | 8/1989 | Fritz |
| 4,867,690 A | 9/1989 | Thumma |
| 4,870,547 A | 9/1989 | Crucefix |
| 4,870,753 A | 10/1989 | Pfeffer et al. |
| 4,894,019 A | 1/1990 | Howard |
| 4,899,266 A | 2/1990 | Ahroni |
| 4,908,743 A | 3/1990 | Miller |
| 4,921,426 A | 5/1990 | Kawasaki et al. |
| 4,934,964 A | 6/1990 | Mazelle |
| 5,015,510 A | 5/1991 | Smith |
| 5,033,976 A | 7/1991 | Sarian et al. |
| 5,051,877 A | 9/1991 | Liao |
| 5,071,362 A | 12/1991 | Martens et al. |
| 5,073,132 A | 12/1991 | Nottrott |
| 5,088,669 A | 2/1992 | Zinnbauer |

(56) References Cited

U.S. PATENT DOCUMENTS

| | | |
|---|---|---|
| 5,091,834 A | 2/1992 | Kao et al. |
| 5,104,608 A | 4/1992 | Pickering |
| 5,109,324 A | 4/1992 | Ahroni |
| 5,121,310 A | 6/1992 | Ahroni |
| 5,139,343 A | 8/1992 | Lin |
| 5,149,282 A | 9/1992 | Donato et al. |
| 5,154,508 A | 10/1992 | Ahroni |
| 5,213,407 A | 5/1993 | Eisenbraun |
| 5,217,382 A | 6/1993 | Sparks |
| 5,218,233 A | 6/1993 | Takahashi |
| 5,281,158 A | 1/1994 | Lin |
| 5,334,025 A | 8/1994 | Föhl |
| 5,342,661 A | 8/1994 | Wilcox, II |
| 5,349,780 A | 9/1994 | Dyke |
| 5,350,315 A | 9/1994 | Cheng et al. |
| 5,366,386 A | 11/1994 | Liao |
| 5,380,215 A | 1/1995 | Huang |
| 5,389,008 A | 2/1995 | Cheng et al. |
| 5,390,463 A | 2/1995 | Sollner |
| D356,246 S | 3/1995 | Adams |
| 5,409,403 A | 4/1995 | Falossi et al. |
| 5,422,766 A | 6/1995 | Hack et al. |
| 5,442,258 A | 8/1995 | Shibata |
| 5,453,664 A | 9/1995 | Harris |
| 5,455,750 A | 10/1995 | Davis et al. |
| 5,456,620 A | 10/1995 | Kaminski |
| 5,481,444 A | 1/1996 | Schultz |
| D367,257 S | 2/1996 | Buelow et al. |
| 5,517,390 A | 5/1996 | Zins |
| 5,518,425 A | 5/1996 | Tsai |
| 5,536,538 A | 7/1996 | Hartung |
| 5,541,818 A | 7/1996 | Ng et al. |
| 5,550,720 A | 8/1996 | Carroll |
| 5,559,681 A | 9/1996 | Duarte |
| 5,560,975 A | 10/1996 | Casper |
| D375,483 S | 11/1996 | Tashiro |
| 5,580,159 A | 12/1996 | Liu |
| 5,586,905 A | 12/1996 | Marshall et al. |
| 5,605,395 A | 2/1997 | Peng |
| 5,607,328 A | 3/1997 | Joly |
| 5,624,283 A | 4/1997 | Hotea |
| 5,626,419 A | 5/1997 | Lin |
| 5,639,157 A | 6/1997 | Yeh |
| 5,652,032 A | 7/1997 | Kaczor et al. |
| 5,653,616 A | 8/1997 | Hotea |
| 5,695,279 A | 12/1997 | Sonnleitner et al. |
| 5,702,262 A | 12/1997 | Brown et al. |
| 5,702,268 A | 12/1997 | Lien et al. |
| 5,707,136 A | 1/1998 | Byers |
| 5,709,457 A | 1/1998 | Hara |
| 5,712,002 A | 1/1998 | Reilly, III |
| 5,720,544 A | 2/1998 | Shu |
| 5,722,766 A | 3/1998 | Shu |
| 5,727,872 A | 3/1998 | Liou |
| 5,759,062 A | 6/1998 | Chen |
| 5,775,933 A | 7/1998 | Chen |
| 5,776,559 A | 7/1998 | Woolford |
| 5,776,599 A | 7/1998 | Haluska et al. |
| 5,785,412 A | 7/1998 | Wu et al. |
| 5,788,361 A | 8/1998 | Lee |
| 5,791,765 A | 8/1998 | Lin |
| 5,791,940 A | 8/1998 | Chen et al. |
| 5,807,134 A | 9/1998 | Hara |
| 5,816,849 A | 10/1998 | Schmidt |
| 5,816,862 A | 10/1998 | Tseng |
| 5,820,248 A | 10/1998 | Ferguson |
| 5,822,855 A | 10/1998 | Szczesny et al. |
| 5,828,183 A | 10/1998 | Wang et al. |
| 5,829,865 A | 11/1998 | Ahroni |
| 5,834,901 A | 11/1998 | Shen |
| 5,839,819 A | 11/1998 | Pan |
| 5,848,838 A | 12/1998 | Presta |
| 5,852,348 A | 12/1998 | Lin |
| 5,854,541 A | 12/1998 | Chou |
| 5,855,705 A | 1/1999 | Gauthier |
| 5,860,731 A | 1/1999 | Martinez |
| 5,860,830 A | 1/1999 | Wu |
| 5,869,151 A | 2/1999 | Chong |
| 5,878,989 A | 3/1999 | Allman |
| 5,893,634 A | 4/1999 | Wang |
| 5,908,238 A | 6/1999 | Huang |
| 5,915,827 A | 6/1999 | Wang |
| 5,921,806 A | 7/1999 | Shuey |
| 5,934,793 A | 8/1999 | Rahman |
| 5,937,496 A | 8/1999 | Benoit et al. |
| 5,938,168 A | 8/1999 | Adams |
| 5,957,723 A | 9/1999 | Gort-Barten |
| 5,966,393 A | 10/1999 | Hide et al. |
| 5,971,810 A | 10/1999 | Taylor |
| 5,979,859 A | 11/1999 | Vartanov et al. |
| 6,004,006 A | 12/1999 | Wang |
| 6,007,362 A | 12/1999 | Davis et al. |
| 6,030,670 A | 2/2000 | Chang |
| 6,053,774 A | 4/2000 | Lin |
| 6,056,427 A | 5/2000 | Kao |
| 6,079,848 A | 6/2000 | Ahroni |
| 6,084,357 A | 7/2000 | Janning |
| 6,086,395 A | 7/2000 | Lloyd et al. |
| 6,095,874 A | 8/2000 | Quaranta |
| 6,099,920 A | 8/2000 | Kao |
| 6,111,201 A | 8/2000 | Drane et al. |
| 6,113,430 A | 9/2000 | Wu |
| 6,116,563 A | 9/2000 | Tsai |
| 6,120,312 A | 9/2000 | Shu |
| 6,123,433 A | 9/2000 | Chen |
| 6,139,376 A | 10/2000 | Ooya et al. |
| 6,147,367 A | 11/2000 | Yang et al. |
| 6,149,448 A | 11/2000 | Haller et al. |
| 6,155,697 A | 12/2000 | Ahroni |
| 6,162,515 A | 12/2000 | Hill |
| 6,203,169 B1 | 3/2001 | Coushaine et al. |
| 6,217,191 B1 | 4/2001 | Wu et al. |
| 6,228,442 B1 | 5/2001 | Coco |
| 6,241,559 B1 | 6/2001 | Taylor |
| 6,245,425 B1 | 6/2001 | McCullough et al. |
| 6,257,736 B1 | 7/2001 | Fehrenbach |
| 6,257,740 B1 | 7/2001 | Gibboney, Jr. |
| 6,257,793 B1 | 7/2001 | Lin |
| 6,261,119 B1 | 7/2001 | Green |
| 6,273,584 B1 | 8/2001 | Wang et al. |
| 6,283,797 B1 | 9/2001 | Wu |
| 6,320,327 B1 | 11/2001 | Lavatelli et al. |
| 6,328,593 B1 | 12/2001 | Chang et al. |
| 6,347,965 B1 | 2/2002 | Pan |
| D454,110 S | 3/2002 | Andre et al. |
| 6,354,719 B1 | 3/2002 | Pan |
| 6,361,368 B1 | 3/2002 | Tseng |
| 6,363,607 B1 | 4/2002 | Chen et al. |
| 6,407,411 B1 | 6/2002 | Wojnarowski et al. |
| 6,452,317 B1 | 9/2002 | Tseng |
| 6,457,839 B1 | 10/2002 | Grandoit |
| 6,458,435 B1 | 10/2002 | Lai |
| 6,514,581 B1 | 2/2003 | Gregory |
| 6,533,437 B1 | 3/2003 | Ahroni |
| 6,541,800 B2 | 4/2003 | Barnett et al. |
| 6,544,070 B1 | 4/2003 | Radliff |
| 6,571,340 B1 | 5/2003 | Lee |
| 6,576,844 B1 | 6/2003 | Kamata |
| 6,580,182 B2 | 6/2003 | Janning |
| 6,588,914 B1 | 7/2003 | Tang |
| 6,592,094 B1 | 7/2003 | Kao |
| 6,595,657 B1 | 7/2003 | Shieh |
| D478,310 S | 8/2003 | Andre et al. |
| 6,609,814 B2 | 8/2003 | Ahroni |
| 6,623,291 B1 | 9/2003 | Tsai |
| 6,634,766 B1 | 10/2003 | Gordon |
| 6,644,836 B1 | 11/2003 | Adams |
| D483,721 S | 12/2003 | Kim et al. |
| 6,666,734 B2 | 12/2003 | Fukatsu |
| 6,672,750 B1 | 1/2004 | Kao |
| D486,385 S | 2/2004 | Smith-Kielland et al. |
| 6,733,167 B1 | 5/2004 | Kao |
| 6,752,512 B2 | 6/2004 | Pan |
| 6,774,549 B2 | 8/2004 | Tsai et al. |

(56) References Cited

U.S. PATENT DOCUMENTS

| | | |
|---|---|---|
| 6,794,825 B1 | 9/2004 | Kao |
| 6,805,463 B2 | 10/2004 | Shieh |
| 6,824,293 B2 | 11/2004 | Chang |
| 6,830,358 B2 | 12/2004 | Allen |
| 6,840,655 B2 | 1/2005 | Shen |
| 6,840,802 B2 | 1/2005 | Shepherd |
| 6,866,394 B1 | 3/2005 | Hutchins et al. |
| 6,869,316 B2 | 3/2005 | Hinkle et al. |
| 6,883,951 B2 | 4/2005 | Wu |
| 6,884,083 B2 | 4/2005 | Shepherd |
| 6,908,215 B2 | 6/2005 | Wu |
| 6,929,383 B1 | 8/2005 | Janning |
| D509,797 S | 9/2005 | Milan |
| 6,942,355 B1 | 9/2005 | Castiglia |
| 6,951,405 B2 | 10/2005 | Yao |
| 6,962,498 B2 | 11/2005 | Kohen |
| 7,021,598 B2 | 4/2006 | Kao |
| 7,029,145 B2 | 4/2006 | Frederick |
| 7,045,965 B2 | 5/2006 | Li et al. |
| 7,052,156 B2 | 5/2006 | Primeau |
| 7,055,980 B2 | 6/2006 | Wu |
| 7,055,981 B2 | 6/2006 | Yao |
| 7,066,628 B2 | 6/2006 | Allen |
| 7,066,739 B2 | 6/2006 | McLeish |
| 7,108,514 B2 | 9/2006 | Chen et al. |
| D530,277 S | 10/2006 | Lin |
| 7,132,139 B2 | 11/2006 | Yang |
| 7,144,610 B1 | 12/2006 | Estes et al. |
| 7,145,105 B2 | 12/2006 | Gaulard |
| 7,147,518 B2 | 12/2006 | Marechal et al. |
| 7,192,303 B2 | 3/2007 | Kohen |
| 7,204,720 B1 | 4/2007 | Shiu |
| 7,207,844 B2 | 4/2007 | Peng |
| 7,235,815 B2 | 6/2007 | Wang |
| 7,253,556 B1 | 8/2007 | Gibboney |
| 7,253,714 B1 | 8/2007 | Tsui |
| 7,264,392 B2 | 9/2007 | Massabki et al. |
| 7,270,450 B2 | 9/2007 | Chan |
| 7,311,566 B2 | 12/2007 | Dent |
| 7,315,692 B2 | 1/2008 | Chow |
| 7,318,744 B2 | 1/2008 | Kuo |
| 7,326,091 B2 | 2/2008 | Nania et al. |
| 7,393,019 B2 | 7/2008 | Taga et al. |
| 7,422,489 B1 | 9/2008 | Tseng |
| D580,355 S | 11/2008 | Hussaini et al. |
| 7,445,824 B2 | 11/2008 | Leung et al. |
| 7,453,194 B1 | 11/2008 | Gibboney |
| D582,846 S | 12/2008 | Lett |
| 7,462,066 B2 | 12/2008 | Kohen |
| D585,384 S | 1/2009 | Andre et al. |
| 7,473,024 B2 | 1/2009 | Gibboney |
| 7,527,508 B1 | 5/2009 | Lee et al. |
| 7,547,843 B2 | 6/2009 | Deve et al. |
| 7,554,266 B1 | 6/2009 | Chen |
| D598,374 S | 8/2009 | Sasada |
| 7,575,362 B1 | 8/2009 | Hsu |
| 7,581,870 B2 | 9/2009 | Massabki et al. |
| 7,585,187 B2 | 9/2009 | Daily et al. |
| 7,585,552 B2 | 9/2009 | Meseke |
| 7,609,006 B2 | 10/2009 | Gibboney |
| D608,685 S | 1/2010 | Krize |
| 7,652,210 B2 | 1/2010 | White |
| D609,602 S | 2/2010 | Krize |
| D611,409 S | 3/2010 | Green et al. |
| 7,695,298 B2 | 4/2010 | Arndt et al. |
| 7,772,495 B2 | 8/2010 | Wu et al. |
| 7,893,627 B2 | 2/2011 | Li |
| D638,355 S | 5/2011 | Chen |
| 8,007,129 B2 | 8/2011 | Yang |
| 8,053,042 B1 | 11/2011 | Loomis |
| 8,062,718 B2 | 11/2011 | Schooley |
| 8,100,546 B2 | 1/2012 | Lutz et al. |
| 8,132,360 B2 | 3/2012 | Jin et al. |
| 8,132,649 B2 | 3/2012 | Rogers |
| 8,298,633 B1 | 10/2012 | Chen |
| 8,348,466 B2 | 1/2013 | Plumb et al. |
| 8,371,028 B2 | 2/2013 | Goldsworthy et al. |
| 8,450,950 B2 | 5/2013 | McRae |
| 8,454,186 B2 | 6/2013 | Chen |
| 8,454,187 B2 | 6/2013 | Chen |
| 8,469,734 B2 | 6/2013 | Chen |
| 8,469,750 B2 | 6/2013 | Chen |
| D686,523 S | 7/2013 | Chen |
| 8,534,186 B2 | 9/2013 | Glucksman et al. |
| 8,562,175 B2 | 10/2013 | Chen |
| 8,568,015 B2 | 10/2013 | Chen |
| 8,569,960 B2 | 10/2013 | Chen |
| 8,573,548 B2 | 11/2013 | Kuhn et al. |
| 8,592,845 B2 | 11/2013 | Chen |
| D696,153 S | 12/2013 | Chen |
| 8,608,342 B2 | 12/2013 | Chen |
| 8,853,721 B2 | 10/2014 | Chen |
| 8,863,416 B2 | 10/2014 | Leung et al. |
| 8,870,404 B1 | 10/2014 | Chen |
| 8,876,321 B2 | 11/2014 | Chen |
| 8,916,242 B2 | 12/2014 | Fu et al. |
| 8,936,379 B1 | 1/2015 | Chen |
| 8,959,810 B1 | 2/2015 | Leung et al. |
| 8,974,072 B2 | 3/2015 | Chen |
| 9,044,056 B2 | 6/2015 | Chen |
| 9,055,777 B2 | 6/2015 | Chen |
| 9,066,617 B2 | 6/2015 | Chen |
| 9,157,587 B2 | 10/2015 | Chen |
| 9,179,793 B2 | 11/2015 | Chen |
| 9,220,361 B1 | 12/2015 | Chen |
| 9,222,656 B2 * | 12/2015 | Chen .................... A47G 33/06 |
| 9,441,800 B1 | 9/2016 | Chen |
| 9,441,823 B1 | 9/2016 | Chen |
| 9,484,687 B1 | 11/2016 | Chen |
| 2002/0002015 A1 | 1/2002 | Mochizuki et al. |
| 2002/0097573 A1 | 7/2002 | Shen |
| 2002/0109989 A1 | 8/2002 | Chuang |
| 2002/0118540 A1 | 8/2002 | Ingrassia |
| 2002/0149936 A1 | 10/2002 | Mueller et al. |
| 2003/0096542 A1 | 5/2003 | Kojima |
| 2003/0142494 A1 | 7/2003 | Ahroni |
| 2003/0198044 A1 | 10/2003 | Lee |
| 2003/0198048 A1 | 10/2003 | Frederick |
| 2003/0206412 A1 | 11/2003 | Gordon |
| 2003/0218412 A1 | 11/2003 | Shieh |
| 2004/0004435 A1 | 1/2004 | Hsu |
| 2004/0012950 A1 | 1/2004 | Pan |
| 2004/0090770 A1 | 5/2004 | Primeau |
| 2004/0096596 A1 | 5/2004 | Palmer, III et al. |
| 2004/0105270 A1 | 6/2004 | Shieh |
| 2004/0115984 A1 | 6/2004 | Rudy et al. |
| 2004/0145916 A1 | 7/2004 | Wu |
| 2004/0161552 A1 | 8/2004 | Butts, Jr. |
| 2004/0182597 A1 | 9/2004 | Smith et al. |
| 2005/0048226 A1 | 3/2005 | Gary et al. |
| 2005/0077525 A1 | 4/2005 | Lynch et al. |
| 2005/0122723 A1 | 6/2005 | Frederick |
| 2005/0249892 A1 | 11/2005 | Rocheleau |
| 2005/0286267 A1 | 12/2005 | Wang |
| 2006/0000634 A1 | 1/2006 | Arakawa |
| 2006/0048397 A1 | 3/2006 | King et al. |
| 2006/0146578 A1 | 7/2006 | Kuo |
| 2006/0164834 A1 | 7/2006 | Kao |
| 2006/0270250 A1 | 11/2006 | Allen |
| 2006/0274556 A1 | 12/2006 | Massabki et al. |
| 2007/0091606 A1 | 4/2007 | Reed |
| 2007/0092664 A1 | 4/2007 | Chun |
| 2007/0177402 A1 | 8/2007 | Wu |
| 2007/0230174 A1 | 10/2007 | Hicks et al. |
| 2007/0253191 A1 | 11/2007 | Chin et al. |
| 2007/0273296 A9 | 11/2007 | Janning |
| 2008/0007951 A1 | 1/2008 | Chan |
| 2008/0025024 A1 | 1/2008 | Yu |
| 2008/0107840 A1 | 5/2008 | Leung et al. |
| 2008/0149791 A1 | 6/2008 | Bradley |
| 2008/0186731 A1 | 8/2008 | Graham |
| 2008/0186740 A1 | 8/2008 | Huang et al. |
| 2008/0205020 A1 | 8/2008 | Vich |
| 2008/0283717 A1 | 11/2008 | Kim et al. |

(56) References Cited

U.S. PATENT DOCUMENTS

| | | |
|---|---|---|
| 2008/0296604 A1 | 12/2008 | Chou et al. |
| 2008/0303446 A1 | 12/2008 | Ding |
| 2008/0307646 A1 | 12/2008 | Zaderej et al. |
| 2009/0002991 A1 | 1/2009 | Huang |
| 2009/0023315 A1 | 1/2009 | Pfeiffer |
| 2009/0059578 A1 | 3/2009 | Lau |
| 2009/0213620 A1 | 8/2009 | Lee |
| 2009/0260852 A1 | 10/2009 | Schaffer |
| 2009/0289560 A1 | 11/2009 | Oliva |
| 2010/0000065 A1 | 1/2010 | Cheng et al. |
| 2010/0053991 A1 | 3/2010 | Boggs |
| 2010/0067242 A1 | 3/2010 | Fung |
| 2010/0072747 A1 | 3/2010 | Krize |
| 2010/0099287 A1 | 4/2010 | Colburn et al. |
| 2010/0136808 A1 | 6/2010 | Vanzo |
| 2010/0159713 A1 | 6/2010 | Nishihira et al. |
| 2010/0195332 A1 | 8/2010 | Wasem |
| 2010/0196628 A1 | 8/2010 | Shooley |
| 2010/0263911 A1 | 10/2010 | Watanabe |
| 2011/0062875 A1 | 3/2011 | Altamura |
| 2011/0076425 A1 | 3/2011 | Cheng et al. |
| 2011/0256750 A1 | 10/2011 | Chen |
| 2012/0009360 A1 | 1/2012 | Fu et al. |
| 2013/0093334 A1 | 4/2013 | Lin et al. |
| 2013/0108808 A1 | 5/2013 | Leung et al. |
| 2013/0301245 A1 | 11/2013 | Chen |
| 2013/0308301 A1 | 11/2013 | Chen |
| 2013/0309908 A1 | 11/2013 | Sandoval et al. |
| 2014/0087094 A1 | 3/2014 | Leung et al. |
| 2014/0215864 A1 | 8/2014 | Fischer, Jr. et al. |
| 2014/0268689 A1 | 9/2014 | Chen |
| 2014/0287618 A1 | 9/2014 | Chen |
| 2014/0334134 A1 | 11/2014 | Loomis |
| 2015/0029703 A1 | 1/2015 | Chen |
| 2015/0070878 A1 | 3/2015 | Yu |
| 2015/0157159 A1 | 6/2015 | Leung et al. |
| 2015/0272250 A1 | 10/2015 | Chen |
| 2016/0007430 A1 | 1/2016 | Kidakarn |
| 2016/0021957 A1 | 1/2016 | Chen |
| 2016/0021958 A1 | 1/2016 | Chen |
| 2016/0033097 A1 | 2/2016 | Chen |

FOREIGN PATENT DOCUMENTS

| | | |
|---|---|---|
| CN | 2242654 Y | 12/1996 |
| CN | 1181693 | 5/1998 |
| CN | 2332290 Y | 8/1999 |
| CN | 2484010 Y | 4/2002 |
| CN | 1509670 A | 7/2004 |
| CN | 2631782 Y | 8/2004 |
| CN | 2751226 Y | 1/2006 |
| CN | 100409504 C | 9/2007 |
| CN | 100409506 C | 8/2008 |
| CN | 201187701 Y | 1/2009 |
| CN | 201829727 U | 5/2011 |
| CN | 102224645 A | 10/2011 |
| DE | 8436328 | 4/1985 |
| DE | 10235081 A1 | 2/2004 |
| EP | 434425 A1 | 6/1991 |
| EP | 0552741 | 7/1993 |
| EP | 0342050 B1 | 8/1995 |
| EP | 0727842 | 8/1996 |
| EP | 895742 B1 | 2/1999 |
| EP | 0920826 A1 | 6/1999 |
| EP | 1 049 206 A2 | 11/2000 |
| EP | 1763115 A2 | 3/2007 |
| EP | 2436808 | 4/2012 |
| EP | 2533374 A1 | 12/2012 |
| FR | 1215214 | 4/1960 |
| GB | 1150390 | 4/1969 |
| GB | 1245214 | 9/1971 |
| GB | 2112281 A | 7/1983 |
| GB | 2137086 A | 10/1984 |
| GB | 2 169 198 A | 7/1986 |
| GB | 2172135 A | 9/1986 |
| GB | 2178910 A | 2/1987 |
| GB | 2208336 A | 3/1989 |
| GB | 2221104 A | 1/1990 |
| GB | 2396686 A | 6/2004 |
| JP | H11121123 A | 4/1999 |
| WO | WO 91/10093 | 7/1991 |
| WO | WO 96/24966 | 8/1996 |
| WO | WO 96/26661 A1 | 9/1996 |
| WO | WO 2004/008581 A1 | 1/2004 |
| WO | WO 2007140648 A1 | 12/2007 |
| WO | WO 2009/115860 A1 | 9/2009 |

OTHER PUBLICATIONS

Petition for Inter Partes Review, Case IPR2016-00801, U.S. Pat. No. 8,454,187, dated Apr. 18, 2016 (69 pgs.).
Petition for Inter Partes Review, Case IPR2016-00800, U.S. Pat. No. 8,454,186, dated Apr. 18, 2016 (78 pgs.).
U.S. Appl. No. 12/157,136, filed Jun. 5, 2008, inventor Johnny Chen.
U.S. Appl. No. 90/012,209, filed Mar. 26, 2012, inventor Johnny Chen.
Petition for Inter Partes Review of U.S. Pat. No. 8,454,187, Case No. IPR2014-01264, filed Aug. 8, 2014, available at https://ptabtrials.uspto.gov.
Petition for Inter Partes Review of U.S. Pat. No. 8,454,186, Case No. IPR2014-01263, filed Aug. 8, 2014, available at https://ptabtrials.uspto.gov.
U.S. Appl. No. 14/851,148, filed Sep. 11, 2015, Inventor Johnny Chen.
U.S. Appl. No. 14/970,118, filed Dec. 15, 2015, Inventor Johnny Chen.
U.S. Appl. No. 15/150,252, filed May 9, 2016, Inventors Alec Hwa et al.
U.S. Appl. No. 15/239,368, filed Aug. 17, 2016, Inventor Johnny Chen.
Petition for Inter Partes Review, Case IPR2016-01611, U.S. Pat. No. 8,454,187, dated Aug. 26, 2016 (91 pgs.).
Petition for Inter Partes Review, Case IPR2016-01612, U.S. Pat. No. 8,454,187, dated Aug. 26, 2016 (93 pgs.).
Petition for Inter Partes Review, Case IPR2016-01609, U.S. Pat. No. 8,454,186, dated Sep. 2, 2016 (99 pgs.).
Petition for Inter Partes Review, Case IPR2016-01610, U.S. Pat. No. 8,454,186, dated Sep. 2, 2016 (86 pgs.).
Petition for Inter Partes Review, Case IPR2016-01615, U.S. Pat. No. 8,936,379, dated Sep. 2, 2016 (90 pgs.).
Petition for Inter Partes Review, Case IPR2016-01617, U.S. Pat. No. 8,936,379, dated Sep. 2, 2016 (63 pgs.).
Petition for Inter Partes Review, Case IPR2016-01616, U.S. Pat. No. 8,936,379, dated Sep. 13, 2016 (89 pgs.).
Petition for Inter Partes Review, Case IPR2016-001613, U.S. Pat. No. 9,044,056, dated Sep. 1, 2016 (91 pgs.).

\* cited by examiner

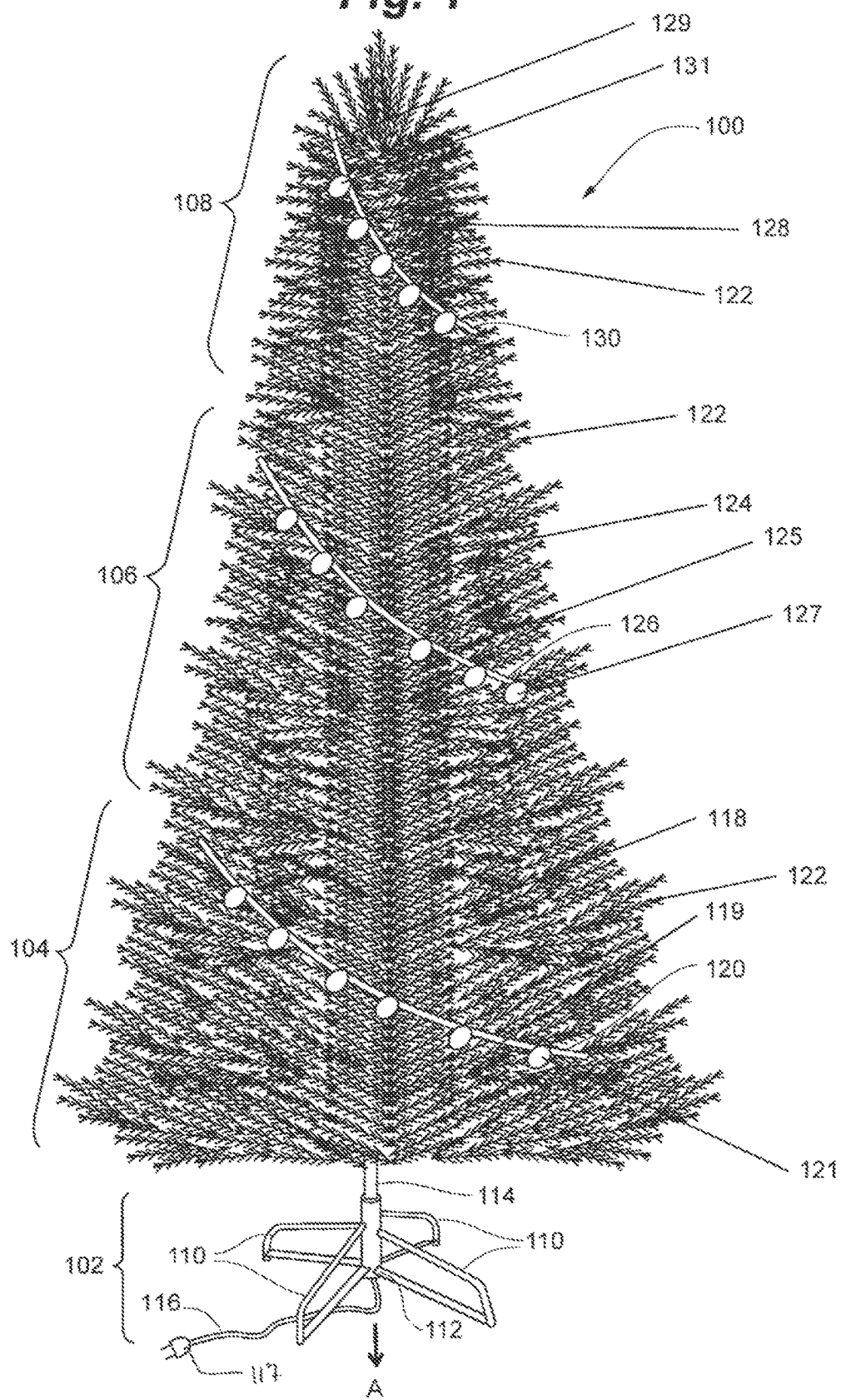

US 9,677,749 B2

CONFORMAL POWER ADAPTER FOR LIGHTED ARTIFICIAL TREE

CROSS-REFERENCE TO RELATED APPLICATIONS

The present application is a continuation of U.S. patent application Ser. No. 14/064,650, filed Oct. 28, 2013, which is a continuation of U.S. patent application Ser. No. 13/295,842, filed Nov. 14, 2011, now U.S. Pat. No. 8,569,960, issued Oct. 29, 2013, both of which are hereby incorporated by reference herein in their entireties.

TECHNICAL FIELD

The present invention relates generally to lighted artificial trees. More particularly, the present invention relates to power adapters for transferring electrical energy to lighted artificial trees.

BACKGROUND

For the sake of convenience and safety, consumers often substitute artificial trees constructed of metal and plastic for natural evergreen trees when decorating homes, offices, and other spaces, especially during the holidays. Such artificial trees generally include multiple tree sections joined at the trunk and held erect by a floor-based tree stand. Traditionally, consumers wrap strings of lights about the artificial tree to enhance the decorative quality of the tree display. As more and more decorative light strings are draped around the tree, it becomes more and more difficult to provide power to the various light strings distributed throughout the tree.

To ease this burden to the consumer, manufacturers have created "pre-lit" artificial trees. Typical pre-lit trees include an artificial tree with multiple standard light strings distributed about the exterior of the tree. Wires of the light string are clipped to branch structures, while plug ends dangle throughout the branches. Generally, multi-purpose decorative light strings are used in pre-lit trees, often limited to 50 or 100 bulb assemblies, with a bladed power plug for insertion into the back outlet of another light string, or insertion into an alternating current (AC) power source.

Light-emitting diode (LED) lighting has gained in popularity as a replacement for traditional incandescent lighting, particularly on lighted artificial trees. LED lighting provides a source of illumination for a variety of lighting applications, including decorative lighting, automotive lighting, architectural lighting, and other such applications, like lighting for artificial trees. However, LED lighting generally operates at low voltage. Further, low voltage, direct current (DC), is safer in home applications. Thus, an adapter or power converter is typically utilized in LED applications. A suitable adapter can receive the electrical energy from a 120V AC power source and output DC power based on the particular lighting requirements of the LED light. In doing so, the overall power rating is also reduced. Pre-lit trees utilizing LEDs have likewise required an adapter to relay the desired power to the LED light strings.

Conventional light strings utilizing DC-powered LEDs have traditionally incorporated an adapter connected to an AC power cord. Thus, on a pre-lit tree with multiple light strings, there are multiple plugs and adapters for the user to plug and subsequently unplug when assembling and disassembling the tree. Multiple cords being placed around the tree creates an inconvenience and is an eyesore detracting from the beauty of the pre-lit tree In other conventional pre-lit trees utilizing LEDs, a central adapter has been incorporated into the wall plug. However, because of the weight and shape of the adapter, such adapters have a tendency to fall out of vertical wall outlets. Additionally, because of the increased size of wall-outlet-adapters, it can be difficult to use such plugs at an individual wall outlet with other electrical plugs, or with a power strip with other electrical plugs.

In any case, an undesirable appearance results. In the case of an adapter as a discrete element in addition to the AC power cord, multiple cords and an unsightly adapter are visible near the tree. In the case of a wall-outlet adapter, a bulky plug is often visible near the tree.

Thus, there is a need for an adapter for use with pre-lit artificial trees that employs a single cord and sleek wall plug where the adapter is hidden from view, thus increasing the safety and desirable appearance of the power assembly.

SUMMARY

In an embodiment, the present invention comprises a conformal power adapter for insertion into a lighted artificial tree and for converting power received from an external power source to a power usable by the lighted artificial tree. The power adapter comprises: an elongated housing including a first end, and a second end; a printed circuit board assembly including power-converting circuitry for converting an input electrical power to an output electrical power for use by a lighted artificial tree having a hollow trunk section, the printed circuit board assembly located substantially within the elongated housing; a power cord secured to the first end of the housing and in electrical connection with the power converting electronics, the power cord adapted to transmit power from an external power source to the power-converting circuitry. Further, the elongated housing enclosing the printed circuit board assembly is sized to fit substantially within the hollow trunk portion of the lighted artificial tree.

In another embodiment, the present invention comprise a power adapter for converting power received from an external power source to a power usable by lighting elements of a lighted artificial tree. The power adapter comprising: an elongated cylindrical housing for insertion into a trunk of a lighted artificial tree, the housing including a bottom portion connectable to a top portion and defining a central axis extending from a first end of the housing to a second end of the housing; an elongated printed circuit board assembly including a printed circuit board and power-converting circuitry for converting an alternating current (AC) input electrical power to a direct current (DC) output electrical power, the printed circuit board assembly secured to the bottom portion of the cylindrical housing and generally aligned along the central axis, the printed circuit board presenting a length and a width, the length being greater than the width; and a power cord secured to the first end of the housing and in electrical connection with the power-converting electronics, the power cord including a power plug in electrical connection with a pair of transmission wires, the power cord for transmitting power from an external power source to the power-converting circuitry.

In another embodiment, the present invention comprises an artificial tree. The artificial tree comprises: a first trunk portion having a first end and defining a cavity defining an inside diameter; a tree base including a trunk support portion, the trunk support portion coupled to the first trunk portion; a power adapter for converting an electrical input power received from an external power source to an electrical output power providing energy to lighting elements of a lighted artificial tree. The power adapter includes: a housing including an elongated body, a first end, and a second end, the housing defining an outside diameter; a printed circuit board assembly including power-converting circuitry for converting the electrical input power to the electrical output, the printed circuit board assembly located substantially within the elongated body of the housing; a power cord secured to the first end of the housing and in electrical connection with the power converting electronics, the power cord transmitting power from the external power source to the power-converting circuitry; and an output power connection adjacent the second end of the elongated housing and in electrical connection with the power-converting circuitry, the output power connection for supplying output power to the lighting elements of the lighted artificial tree. Further, the housing of the power adapter is located substantially within the cavity of the first trunk portion or the trunk support portion or a combination thereof.

In yet another embodiment, the present invention comprises a method of assembling an artificial tree. The method comprises: providing a tree base defining a hollow portion and configured to receive a generally cylindrical power adapter and an end of a trunk portion of an artificial tree; providing the generally cylindrical power adapter, the power adapter including an elongated housing portion enclosing power-converting electronics, a power plug, and power plug wiring, the power plug wiring electrically connecting the power-converting electronics to the power plug; and inserting at least a portion of the elongated housing portion into the hollow portion of the tree base, while the power plug and a portion of the power plug wiring remain external to the tree base.

The present invention therefore substantially meets the aforementioned needs of the industry. Embodiments of the present invention as described above provide a number of features and benefits. Safety of the tree, adapter, and surrounding area is increased. Because the adapter is hidden inside the trunk of the tree, critical wires connecting the wall plug to the adapter and the adapter to the main electrical bus are not exposed. Further, only a single cord is required to run from the wall to the adapter in order to power the lighting elements of the tree. The unnecessary tripping hazard of multiple cords being placed around the tree is therefore avoided. For some embodiments, air gaps exist within the adapter body between both the top section of the adapter housing and the electrical components, as well as between the bottom section of the adapter housing and the board assembly. Such a configuration allows for greater heat dissipation than other adapter housing shapes where the board assembly is placed directly adjacent one of the walls of the adapter housing. Also, because the adapter of the present invention is not of the wall-outlet adapter type, there is no risk of the adapter out of vertical wall outlets due to increased weight. Moreover, the wall plug can be used easily with other electrical plugs at wall outlets or with power strips. Further, because of the adapter placement within both the base and the first trunk portion within the base, the tree accords greater stability for the portion of the tree extending therefrom.

Another feature and advantage of the various embodiments of the present invention is that the appearance of the tree and the surrounding area is more visually appealing. As mentioned, the adapter is hidden from view. Thus, no large electrical component near the tree distracts from the tree's appearance. Likewise, only a sleek wall plug is required to be plugged into an electrical outlet. No bulky-adapter distracts from the appearance of the tree. Further, in an embodiment, only a single cord runs from the wall outlet to the tree, thus minimizing the cords visible around the tree. All of these elements add to the appeal of the appearance of the tree and surrounding display.

Another feature and advantage of the various embodiments of the present invention is that the tree is more convenient to use. As mentioned, only a single plug is required to be connected to an electrical outlet in order to assemble the electrical elements of the tree, and thereby provide power to the lighting elements. Likewise, only a single plug is required to be disconnected from an electrical outlet in order to disassemble the electrical elements of the tree.

The above summary of the invention is not intended to describe each illustrated embodiment or every implementation of the present invention. The figures and the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIG. 1 is a front perspective view of a modular, lighted artificial tree, according to an embodiment of the present invention;

Figure 3:
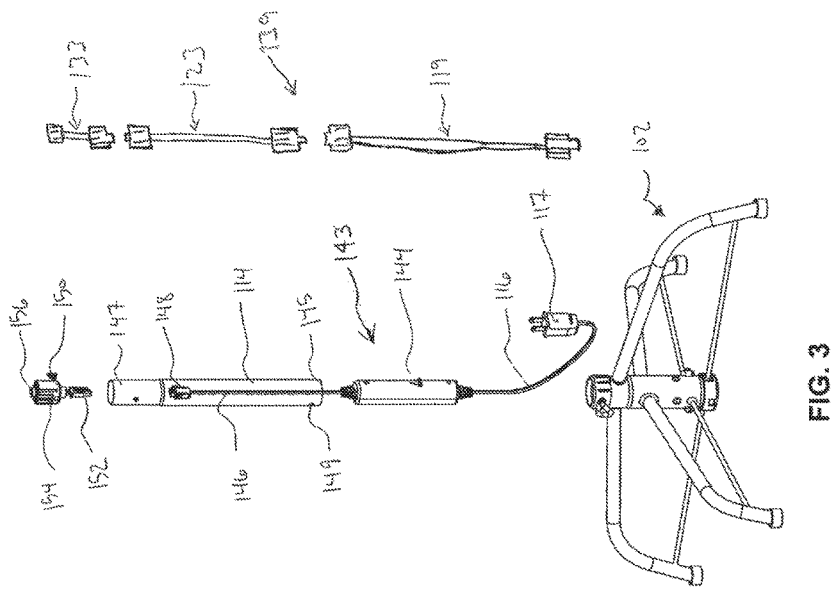
FIG. 3 is an exploded front view of the base of FIG. 2 with a power adapter, base-trunk portion, and power clip prior to installation, and a tree wire harness.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

Referring to FIG. 1, an embodiment of a lighted artificial tree 100 of the present invention is depicted. Lighted artificial tree 100 includes base portion 102, first lighted tree portion 104, second lighted tree portion 106, and third lighted tree portion 108. In some embodiments, tree 100 can include more lighted tree portions, such as a fourth lighted tree portion, or can include fewer lighted tree portions. When tree 100 is assembled, as depicted in FIG. 1, lighted tree portions 104, 106, and 108 are aligned along a common vertical axis A and held in a generally vertical orientation by base portion 102.

Base portion 102 as depicted includes multiple legs 110 connected to a central trunk support portion 112, and an outlet-engaging plug 117 connected via input wiring 116. As depicted, trunk support portion 112 can be generally cylindrical to receive and support first tree portion 104. Although depicted as presenting a circular cross-section, trunk support section 112 may present other cross-sectional shapes, such as a square, hexagon, octagon, and so on. Base portion 102 can include an optional base-trunk portion 114 extending upwardly from trunk support portion 112 to form a portion of a trunk of tree 100. Base trunk portion may be separate from, or integrated with, trunk support portion 112. In other embodiments, base portion 102 can comprise other configurations capable of supporting and aligning tree portions 104, 106, and 108 in a steady, upright manner. Such alternate embodiments include a base portion having more or fewer legs 110, an integrated structure with an opening for receiving first lighted tree portion 104, and other such embodiments. The wiring 116 for outlet-engaging plug 117 extends from trunk support portion 112 at the end opposite the end receiving first tree portion 104. Plug 117 is adapted to be inserted into an electrical outlet in order to power lighted tree portions 104, 106, and 108.

First lighted tree portion 104 includes first trunk portion 118, first trunk wire harness 139 (see FIG. 3) one or more first light strings 120, and multiple branches 122.

First trunk portion 118 comprises a generally cylindrical, hollow structure configured to operably couple to base 102 at one end via trunk support portion 112 or optionally, base-trunk portion 114 and to operably couple to second lighted tree portion 106 at the opposite end. Multiple branches 122 are operably coupled along first trunk portion 118.

In an embodiment, first trunk wire harness 139 may be wholly or partially inside first trunk portion 118. First trunk wire harness 139 may include two or more wires, each wiring including an inner conductive portion and an outer insulative portion. In an embodiment, first trunk wire harness 139 includes only two wires, for providing power to all light strings 120, and to other tree sections. In another embodiment, first trunk wire harness 139 includes more than two wires. In such an embodiment, multiple pairs of wires power and control selected light strings 120 and/or other light strings of second tree portion 106 and third tree portion 108.

First light string 120 includes light string wiring 119 and a plurality of lighting elements 121 and is affixed to one or more branches 122 of lighted tree portion 104. Light string wiring 119 is electrically connected to first trunk harness 139. Connection of light string wiring 119 to wires of first trunk harness 139 may be accomplished by any number of known connection means, including by soldering, crimping, and use of various electrical connection devices. Lighting elements 121 can comprise incandescent bulbs, light-emitting diodes, a combination thereof, or any other known types of light-emitting elements. Lighting elements 121 may be electrically connected in parallel, series, or a combination of series and parallel, to form a parallel-connected, series-connected, parallel-series connected, or series-parallel connected first light string 120.

Similarly, second lighted tree portion 106 includes second trunk portion 124, second trunk wire harness 123, one or more second light strings 126, and multiple branches 122. Second trunk portion 124 comprises a generally cylindrical, hollow structure configured to operably couple to first trunk portion 118 at one end and to operably couple to third lighted tree portion 108 at the opposite end. Multiple branches 122 are operably coupled along second trunk portion 124. In an embodiment, second trunk wire harness 123 may be wholly or partially inside second trunk portion 124, and may include two or more wires. Second light string 126 includes light string wiring 125 and a plurality of lighting elements 127 and is affixed to one or more branches 122 of lighted tree portion 106. Second light string wiring 125 is electrically connected to second trunk harness 123. Lighting elements 127 can comprise the same lighting elements as described above with respect to lighting elements 121.

Likewise, third lighted tree portion 108 includes third trunk portion 128, third trunk wire harness 133, one or more third light strings 130, and multiple branches 122. Third trunk portion 128 comprises a generally cylindrical, hollow structure configured to operably couple to second trunk portion 118 at one end. Multiple branches 122 are operably coupled along third trunk portion 128. In an embodiment, third trunk wire harness 133 may be wholly or partially inside third trunk portion 128, and may include two or more wires. Third light string 130 includes light string wiring 129 and a plurality of lighting elements 131 and is affixed to one or more branches 122 of lighted tree portion 108. Third light string wiring 129 is electrically connected to third trunk harness 133. Lighting elements 131 can comprise the same lighting elements as described above with respect to lighting elements 121 and lighting elements 127.

Figure 2:
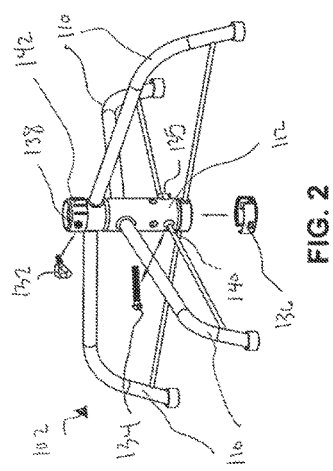
FIG. 2 is a front perspective view of a base of a modular, lighted artificial tree.

Referring to FIG. 2, a more detailed front perspective view an embodiment of base portion 102 is depicted. Assembly components that aid in the construction of base 102 and further, tree 100, comprise pin 132, bolt 134, and in some embodiments, bottom cap 136, and top cap 142.

As such, trunk support portion 112 further includes aperture 140 located on one side of trunk support portion 112, typically near the bottom of trunk support portion 112, and an aperture located directly opposite aperture 140 (not shown). Trunk support portion 112 may optionally include a threaded nut 135 located on the aperture directly opposite aperture 140. Trunk support portion 112 can have ridges on its inner walls to create an opening at a point or points along trunk support portion 112 that has a relative circumference less than that of the outer walls of base-trunk portion 114. This further supports base-trunk portion 114 when base-trunk portion 114 and trunk support portion 112 are in an upright position. The ridges create a floor that base-trunk portion 114 can rest on within trunk support portion 112, in certain embodiments.

Bolt 134, as depicted, comprises a threaded bolt. Bolt 134 is insertable into aperture 140 of trunk support portion 112 and receivable by threaded nut 135 located on the aperture directly opposite aperture 140. Bolt 134, once secured, fixes base-trunk portion 114 in place. Other bolts or securing rods can be utilized in other embodiments.

As depicted, optional top cap 142 acts as a stabilizing joint between trunk support portion 112 and base-trunk portion 114. Top cap 142 can be made of metal or plastic similar to that used in other elements of tree 100. Top cap 142 is substantially cylindrical and of a size such that the inner walls of top cap 142 make an interference fit with the outer walls of trunk support portion 112 and still allowing for base-trunk portion 114 to be slidably insertable into trunk portion 112. An optional lip can engage the walls of trunk support portion 112. Top cap 142 contains one or more apertures 138 for receiving pin 132. In certain embodiments, aperture 138 can be threaded.

Pin 132 is insertable into aperture 138 of top cap 142. In embodiments, pin 132 can be threaded such that corresponding threads on aperture 138 allow for uniform insertion and receding through top cap 142. After installation of trunk support portion 112 in base-trunk portion 114, pin 132 can be inserted in aperture 138 to apply pressure to the outer walls of base-trunk portion 114 to further stabilize base-trunk portion 114 and the tree portions extending therefrom.

Bottom cap 136 is operably coupleable to the end of trunk support portion 112 distal the end of top cap 142. Bottom cap 136 can be clipable or snapable onto trunk support portion 112 and legs 110 to further define the cylinder of trunk support portion 112. Bottom cap 136 can be made of metal or plastic similar to that used in top cap 142. Bottom cap 136 is substantially cylindrical and of a size such that the inner walls of top cap 142 make an interference fit with the outer walls of trunk support portion 112.

Referring to FIG. 3, an exploded front perspective view of base 102 with a power adapter 144, base-trunk portion 114, and an optional trunk plug 150, is depicted. Wiring harness 139 is also depicted. The adapter assembly in an embodiment may therefore include adapter 144, outlet-engaging plug 117 connected via input wiring 116, end plug 148 connected via output wiring 146, and trunk plug 150.

Adapter 144 as depicted is substantially elongated and cylindrical to conform to the shape of a trunk of a lighted tree 100 so as to be inserted in the trunk. It will be understood that although adapter 144 presents a substantially circular cross sectional shape, in other embodiments, adapter 144 may present a square, hexagon, octagon, or other cross-sectional shape.

At a first end of adapter 144, input wiring 116 couples to power adapter 144 such that power can be transmitted from an external power source, which may be an AC, or other, power source, to the adapter. At an opposite, second end of adapter 144, output wiring 146 couples to adapter 144 such that power can be transmitted from the adapter to other portions of the tree, including wiring harness 139, or its sub-harnesses, wiring harnesses 119, 123, 133, light strings 120, 126, and 130, and any other electrical components of tree 100. Although depicted as a wire pair comprising two wires, output wiring 146 may comprise more than one pair of wires. In such an embodiment, each pair of wires of output wiring 146 may control selected light sets as controlled by a controller housed within power adapter 144.

Outlet-engaging plug 117, as depicted, comprises a bladed power plug for insertion into an external power source. Outlet-engaging plug 117 is sleek and compact, similar to other standard bladed power plugs. Outlet-engaging plug 117 can be colored similar to branches 122 or base 102 so that it blends with the rest of the tree 100 display. As mentioned above, adapter 144 and outlet-engaging plug 117 are coupled via input wiring 116. Input wiring 116 can be of varying length, in embodiments, in order to accommodate varying lengths of tree 100 from an electrical outlet.

End plug 148, as depicted, in an embodiment comprises a female electrical plug for receiving a corresponding male plug of trunk plug 150. In other embodiments, end plug 148 is male and the corresponding plug of trunk plug 150 is female. Regardless of the specific structure, end plug 148 functions to conveniently electrically connect power adapter 144 to wiring harnesses, lights, and other electrically transmissive or electrically power components of tree 100.

As mentioned above, adapter 144 and end plug 148 are coupled via output wiring 146. Output wiring 146 can be of varying length, in embodiments, in order to accommodate varying lengths of base-trunk portion 114, trunk portions 118, 124, and 128, as appropriate, depending on the placement of adapter 144 within tree 100, as well as opposite input wiring 116 and its extension.

Trunk plug 150, when present, comprises an interconnect plug 152, a housing 154, and a electrical connector 156. Interconnect plug 152 is coupleable with end plug 148 to receive the transformed energy from adapter 144. Interconnect plug 152 is adapted to couple to housing 154. Housing 154 provides a bulky structure for positioning and securing trunk plug 150, and particularly electrical connector 156. As depicted, housing 154 is cylindrical such that the outer walls of housing 154 can make flush contact with the inner walls of base-trunk portion 114, trunk portions 118, 124, and 128, as appropriate. In other embodiments, housing 154 may be sized such that a gap between the inner walls of base trunk portion 114 is formed. Such a gap may allow air flow around portions of housing 114, thus aiding in cooling power adapter 144. Housing 154 encompasses electrical connector 156 such that electrical connector 156 is supported and held in place by housing 154. In an embodiment, electrical connector 156 comprises a two-terminal electrical connector, such as a positive terminal and a negative terminal. In one such embodiment, and as depicted, electrical terminal 156 comprises a coaxial electrical connector. In another embodiment, electrical connector 156 may comprise one or more pins, each pin corresponding to a wire of output wiring 146. In one such embodiment, output wiring 146 includes 4 pairs of wires for powering four groups of light strings.

Thus, when properly installed, electrical connector 156 provides power to first, second, and third lighted tree portions 104, 106, and 108.

Base-trunk portion 114 which as described above may be substantially hollow, or at least include a hollow portion, houses portions of adapter assembly 143, has a first end 145 coupleable with trunk support portion 112, and a second end 147 opposite first end 145 coupleable with first trunk portion 118. Though not shown, base-trunk portion 114 can have ridges on its inner walls to create an opening at a point or points along base-trunk portion 114 that has a relative circumference less than that of the outer walls of adapter 144 in order to support cylindrical adapter 144, similar to trunk support portion 112 supporting base-trunk portion 114 as described above. Such ridges can be located near first end 145, and act as a support floor for cylindrical adapter 144. In other embodiments, no such ridges are present.

Base-trunk portion 114 may further include an aperture 149 for receiving bolt 134. Aperture 149 can align with aperture 140 of trunk support portion 112 so that bolt 134 is received by both aperture 149 and aperture 140. Base-trunk portion 114 can also include an aperture on the side opposite aperture 149 to be aligned with threaded nut 135.

Figure 4:
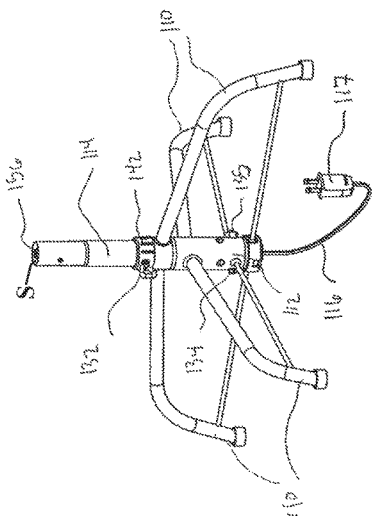
FIG. 4 is a front perspective view of the base of FIG. 3 with a power adapter, base-trunk portion, and power clip installed in the base.

Referring also to FIG. 4, the adapter assembly 143 is installed in base-trunk portion 114 and subsequently in trunk support portion 112 to form an assembled base 102.

Trunk plug 150 is coupled to adapter 144 via the mating of interconnect plug 152 with end plug 148. The mating can be done subsequent to adapter 144 and wiring 146 being partially inserted through base-trunk portion 114, with entry in base-trunk portion 114 at first end 145, so that, once inserted, end plug 148 extends beyond the cylinder of base-trunk portion 114 outside of second end 147. Alternatively, the mating can be done completely outside of base-trunk portion 114, whereby outlet-engaging plug 117 and adapter 144 are subsequently inserted into base-trunk portion 114 at second end 147, leaving trunk plug 150 similarly outside of second end 147. This inserting and mating is typically required when ridges on the inner walls of base-trunk portion 114 are located near first end 145 to support adapter 144, as described above.

In yet another alternative, wires 146 extend beyond the opening of trunk portion 114, for electrical connection to other portions of tree 100, without the aid of trunk plug 150 and possibly without the use of plug 148. As such, it will be understood that power adapter 144 may be used in a variety of lighted trees with a variety of electrical wiring configurations.

Once adapter and wiring 146 are partially threaded in base-trunk portion 114, trunk plug 150 is then inserted into base-trunk portion 114 at second end 147 in the order of interconnect plug 152 first and housing 154 second. Trunk plug 150 is lowered inside base-trunk portion 114 such that it does not extend beyond the cylinder formed by base-trunk portion 114, and electrical connector 156, and its pins or electrical terminals, extend into a space formed within a hollow end of base-trunk portion 114. In other embodiments, trunk plug 150 may extend beyond the cylinder formed by base-trunk portion 114. The outer walls of housing 154 are secured to the inner walls of base-trunk portion 114 so that trunk plug 150 is secured in a fixed position to base-trunk portion 114. Interconnect plug 152, and thus, coupled wiring 146, extends toward first end 145 of base-trunk portion 114 within base-trunk portion 114.

The body of adapter 144 is then fully inserted into base-trunk portion 114 at first end 145. Due to its conformal shape, which in an embodiment is cylindrical, adapter 144 is easily introduced into base-trunk portion 114. In order to accommodate the insertion of adapter 144, wiring 146 may be collapsed or folded inside base-trunk portion 114 as needed. Once so inserted, trunk plug 150, wiring 146, and adapter 144 are fully enclosed within base-trunk portion 114. As depicted, of adapter assembly 143, only outlet-engaging plug 117 and all or a portion of input wiring 116 remain outside base-trunk portion 114. In other embodiments, not including trunk plug 150, plug 148 and a portion of wiring 146 may extend, or be extendable, beyond second end 147 of base-trunk portion 114.

Base-trunk portion 114, having adapter 144, wiring 146, and trunk plug 150 enclosed, is positioned above base 102 near top cap 142. Outlet-engaging plug 117 and wiring 116 are threaded through trunk support portion 112. Bottom cap 136 can be coupled to trunk support portion 112 during outlet-engaging plug 117 and wiring 116 insertion, in embodiments. In other embodiments, bottom cap 136 can be removed prior to outlet-engaging plug 117 and wiring 116 threading and coupled to trunk support portion 112 subsequent to the threading. In yet other embodiments, rather than including a bottom cap 136, base portion 102 employs other structures to keep adapter 144 within trunk portion 112. One example of such an alternate structure is one or more internal cross members spanning the inside diameter of trunk support portion 112.

Base-trunk portion 114 is slidably inserted in trunk support portion 112, with first end 145 of base-trunk portion 114 entering trunk support portion 112 first. Base-trunk portion 114 can then be rotated within trunk support portion 112 so that aperture 140 of trunk support portion 112 and aperture 149 of base-trunk portion 114 are aligned.

Once so aligned, bolt 134 is threaded through aperture 140 of trunk support portion 112, aperture 149 of base-trunk portion 114, below adapter 144, through the opposite side apertures of base-trunk portion 114 and trunk support portion 112, and finally into threaded nut 135. Bolt 134 can be tightened into threaded nut 135 to fix base-trunk portion 114 and trunk support portion 112 in place. By the positioning of bolt 134, adapter 144 is further secured in place.

Pin 132 can likewise be threaded into top cap 142 via aperture 138 and against the outer wall of base-trunk portion 114 to further lock base-trunk portion 114 in place.

Other assembly variations are considered, according to the specific embodiment of tree 100 and base 102. Further, adapter assembly 143 can similarly be installed in first trunk portion 118, second trunk portion 124, or third trunk portion 128, in embodiments. Due to the conformal, elongated and sometimes cylindrical shape of adapter 144, adapter 144 is easily adaptable to placement within other trunk portions.

Referring to FIGS. 5-8, conformal adapter 144 of adapter assembly 143 is further depicted. Adapter 144 comprises an outer housing 161 and a printed circuit board assembly 162.

Figure 5:
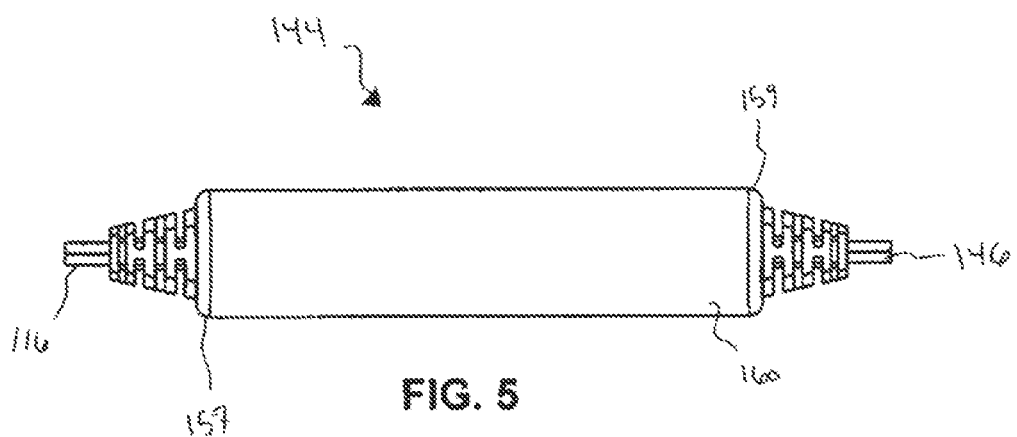
FIG. 5 is a rear elevation view of a cylindrical power adapter according to an embodiment of the present invention.
Figure 6:
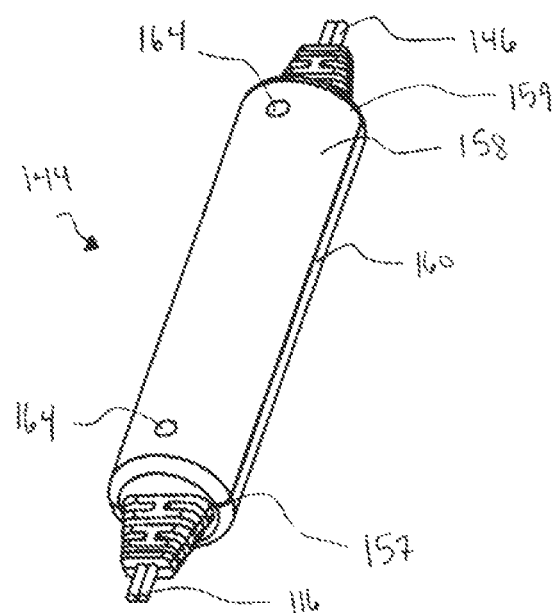
FIG. 6 is a front perspective view of the cylindrical power adapter of FIG. 5.

Referring specifically to FIGS. 5-6, adapter 144 is depicted with a close-up view of outer housing 161. Outer housing 161 comprises a generally cylindrical body having a first end 157 located on the end of adapter 144 that is connected to outlet-engaging plug 117 via input wiring 116, and a second end 159 located on the opposite end of adapter 144, specifically, the end connected to end plug 148 via output wiring 146. Outer housing 161 may be separated along its length to further comprise bottom housing portion 158 and top housing portion 160.

Figure 8:
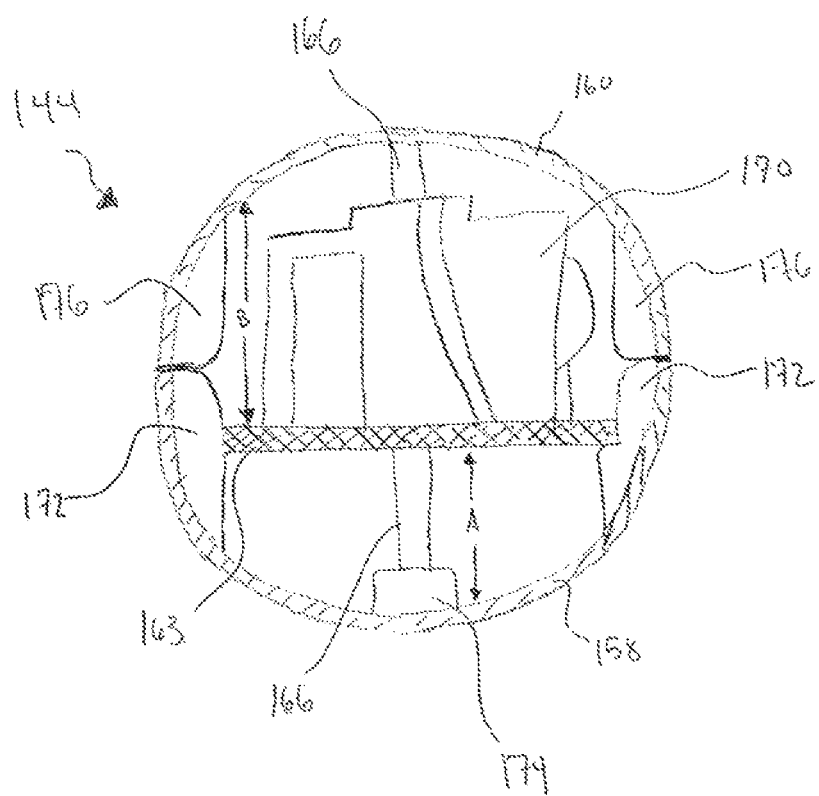
FIG. 8 is a cross-sectional view of the board and cover of the cylindrical power adapter of FIG. 5.

Bottom housing portion 158 in an embodiment, comprises substantially a half cylinder to form the bottom half of the walls of the cylinder of adapter 144. Bottom housing portion 158 includes one or more apertures 164 configured to receive fasteners for securing bottom housing portion 160 to top housing portion 160. As depicted in FIG. 6, a first aperture 164 is positioned near first end 157 of bottom housing portion 158, and a second aperture 164 is positioned near second end 159 of bottom housing portion 158. Referring to FIG. 8, fastener guides 174 are located at each aperture 164 within the inner walls of bottom housing portion 158. Fastener guides have apertures surrounded by guide walls to aid in fastening bottom housing portion 160 with top housing portion 158. At least one side tab 172 is positioned along the inner wall of bottom housing portion 158 to align board assembly 162 within bottom housing portion 158. Additional side tabs 172 can be positioned along the length of bottom housing portion 158 from first end 157 to second end 159. Typically, side tabs 172 are configured in opposing pairs. In other embodiments, a particular side tab 172 will not have a corresponding opposite side tab 172 located on the opposing side of bottom housing portion 158. Bottom housing portion 158 can further comprise a lip or ridge along the border where bottom housing portion 158 and top housing portion 160 meet to create a better friction fit with top housing portion 160. At each lengthwise end of bottom housing 158, apertures combine with corresponding bottom and top apertures on lengthwise ends of top housing portion 160 to allow for the entry of input wiring 116 and output wiring 146, respectively, into outer housing 161.

Top housing portion 160 comprises substantially a half cylinder to form the top half of the walls of the cylinder of adapter 144. Top housing portion 160 includes one or more fastener receiving posts 166 for receiving fasteners that secure top housing portion 160 with bottom housing portion 158. Fastener receiving posts 166 are positioned along the length of top housing portion 160 at the relative locations of apertures 164 and fastener guides 174 of bottom housing portion 158 when top housing portion 160 and bottom housing portion 158 are assembled, as depicted in FIGS. 5-6. Therefore, each aperture 164, fastener guide 174, and fastener receiving post 166 share an axis. At least one side tab 176 is positioned along the inner wall of top housing portion 160 at the relative location or locations of side tabs 172 of bottom housing portion 158 when top housing portion 160 and bottom housing portion 158 are assembled. In some embodiments, corresponding to a similar configuration of side tabs 172, side tabs 176 are configured in opposing pairs. Side tabs 176 provide an opposing force for side tabs 172 so that when outer housing 161 is fastened together, the stress of the fasteners pulling housing portions 158 and 160 together is distributed throughout top housing portion 160 and bottom housing portion 158 via the contact of side tabs 172 with side tabs 176. Therefore, stress is relieved from the fastener axes. Top housing portion 160 can further comprise a lip or ridge along the border where top housing portion 160 and bottom housing portion 158 meet to create a better friction fit with bottom housing portion 158. At each lengthwise end of top housing portion 160, apertures combine with corresponding apertures on lengthwise ends of bottom housing portion 158 to allow for the entry of input wiring 116 and output wiring 146, respectively, into outer housing 161.

Figure 7:
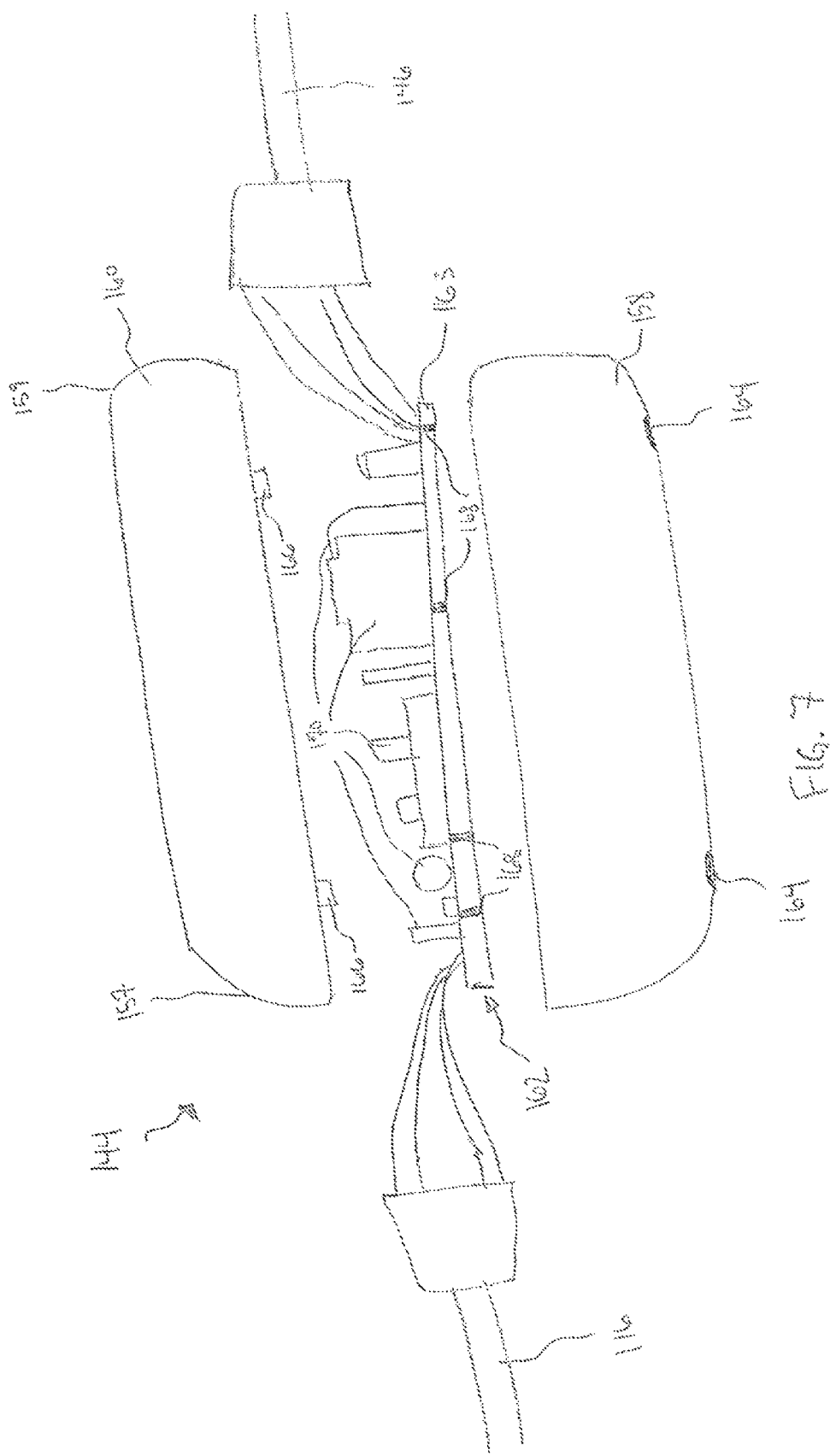
FIG. 7 is a perspective view of the board and cover of the cylindrical power adapter of FIG. 5.

Referring to FIG. 7, board assembly 162 comprises circuit board 163 and electronic components 170. Electronic components 170 include power-conditioning electronic circuitry and components. In an embodiment, electronic components 170 may also include control electronics.

Circuit board 163 in an embodiment is elongated and substantially rectangular and configured to fit lengthwise into outer housing 161. Circuit board 163 can be made of any suitable circuit board material. For example, a paper-based, fiberglass, plastic, ceramic, or metal core can be utilized. Conducting layers can be made of thin copper foil. Insulating layers dielectric are typically laminated together with epoxy resin. Further, circuit board 163 can be coated with a solder mask. In embodiments, circuit board 163 can comprise material suitable for mounting electronics in through-hole construction or point-to-point construction. One skilled in the art will appreciate that numerous circuit board constructions are possible.

Circuit board 163 may include at least one aligning notch 168. Aligning notch 168 comprises a void cut into the sidewall of circuit board 163. Aligning notch 168 is adapted to receive a portion of side tab 172. In embodiments, corresponding aligning notches 168 are located on circuit board 163 on opposing sidewall sides, in embodiments of bottom housing portion 158 where side tabs 172 are configured in opposing pairs along the inner walls of bottom housing portion 158. Aligning notches 168 are positioned along circuit board 163 at the relative location of side tabs 172 when circuit board 163 is seated within bottom housing portion 158. Thus, in order for circuit board 163 to seat properly within bottom housing portion 158, every aligning notch 168 must correspond to every side tab 172, and vice versa, in both size and location, such that side tab 172 is receivable within its corresponding aligning notch 168. Aligning notches 168 can be staggered along circuit board 163 sidewall to create a unique pattern. Accordingly, side tabs 172 can be staggered in the same pattern along the inner walls of bottom housing portion 158 so that circuit board 163 can only seat within bottom housing portion 158 in one way. Such a configuration of side tabs 172 and aligning notches 168 ensures that circuit board 163 is aligned properly within outer housing 161, which enables not only the proper function of adapter 144, but also ease of manufacturability. Further, added stability is created by the interlocking of side tabs 172 with aligning notches 168. Circuit board 163 is effectively locked in place once it is seated within bottom housing portion 158, which further aids in manufacturing.

Electronic components 170 comprise a plurality of electronic components populated on circuit board 163. Power conditioning electronic circuitry and componetry of electronic components 170 are configured to convert energy from a type useful in a standard wall circuit to one useful in powering the respective light strings of tree 100.

Electronic components 170 may include an electrical transformer for reducing incoming voltage. Electronic components 170 may also include power-conditioning components for rectifying AC power to DC, such as a full or half wave rectifier, including capacitors, as understood by those skilled in the art. In an embodiment, electronics 170 of adapter 144 converts incoming 120 VAC to 3 VDC. In other embodiments, adapter 144 may convert 110-120 VAC to 12 VAC, 12 VDC, 9 VDC, and so on. Those skilled in the art will appreciate that a number of similar combinations are possible. One skilled in the art will readily understand the components required. Electronics 170 are laid out on elongated circuit board 163 such that the components can be contained within outer housing 161.

In an embodiment, electronic components 170 also include control electronics, such that conformal power adapter 144 comprises a power adapter and controller combination. Known controllers as used in decorative lighting typically are housed in a dedicated enclosure. By eliminating the need for separate, dedicate, and sometimes multiple, control boxes or housings that may be visible to a user, the aesthetics of lighted tree 100 may be further improved.

Such control electronics may comprise a processor, such as a microprocessor, microcontroller, and other such control electronics. Control electronics may also comprise memory in electrical communication with the processor for storing instructions for operating or controlling groups of light strings, individual light strings, groups of lighting elements or individual lighting elements The control electronics may be configured to selectively control power to groupings of light strings 120, 126, and 130. In one such embodiment, a processor controls distribution of power to light strings 120, 126, and 130, by grouping all light strings 120 together for power and control, all light strings 126 together and all light strings 130 together. In this embodiment, light strings 120 may be powered independent of light strings 126 and 130; light strings 126 powered independently of light strings 120 and 130, and light strings 130 independent of 120 and 126. For example, the control electronics may cause light strings 120 to flash on and off, while light strings 126 and 130 are constantly powered.

In assembling adapter 144, board assembly 162, having input wiring 116 and output wiring 146 coupled to circuit board 163 at the appropriate respective ends, is positioned above bottom housing portion 158 such that the pattern of aligning notches 168 matches the pattern of side tabs 172. As described above, in an embodiment, input wiring 116 comprises a pair of power-carrying wires, while output wiring 146 comprises at least one pair of power-carrying wires. If power adapter 144 comprises additional control electronics, output wiring may include more than two wires.

Circuit board 163 is lowered into bottom housing portion 158 such that aligning notches 168 receive side tabs 172. Circuit board 163 is properly seated intermediate bottom housing portion 158 such that the sidewalls of circuit board 163 rest against the walls of bottom housing portion 158 and side tabs 172 are mated with aligning notches 168. Top housing portion 160 is positioned above bottom housing portion 158 such that side tabs 176 match the pattern of side tabs 172. Top housing portion 160 is lowered onto bottom housing portion 158 until the lip or ridge of top housing portion 160 meets the corresponding lip or ridge of bottom housing portion 158. Fasteners, for example, screws, are threaded through apertures 164, through fastener guides 174, and into fastener receiving posts 166 to mate bottom housing portion 158 with top housing portion 160. Adapter 144 is then fully assembled and ready for assembly into tree 100 as described above.

Referring to FIG. 8, a cross-sectional view of adapter 144 is illustrated. As depicted, circuit board 163 is seated intermediate bottom housing portion 158, as secured by the sidewalls of circuit board 163 resting against the inner walls of bottom housing portion 158 and the interlocking of side tabs 172 with aligning notches 168. Because of the positioning of circuit board 163 relative to bottom housing portion 158, an air gap exists between circuit board 163 and bottom housing portion 158, labeled gap A. Additionally, a second air gap, labeled gap B, exists between circuit board 163 and top housing portion 160.

Heat is generated by adapter electronics 170 when adapter 144 is in operation. Gaps A and B act to dissipate that heat to ensure the continued safe operation of adapter 144. The design of outer housing 161 and placement of circuit board 163 within outer housing 161 facilitates heat dissipation greater than that of traditional adapters. Traditional adapter housings typically allow heat dissipation via any air gap that may encompass the electronics on the populated side of the circuit board. Gap B provides for that dissipation. However, additional heat dissipation is allowed through gap A on the unpopulated side of circuit board 163 because the walls of bottom housing portion 158 are not immediately adjacent circuit board 163. Thus, adapter 144 provides a more effective, safer method of heat dissipation than traditional adapters.

Power adapter 144 may further dissipate heat through conduction of housing 161 to base trunk portion 114, which acts as a heat sink. Such conduction is not possible with known wall-plug-style power adapters, such that power adapter 144 provides improved heat-dissipating characteristics over the prior art.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed:

1. An artificial lighted tree, comprising:
   power-conditioning circuitry configured to receive an input power and output an output power;
   a first tree portion including a first trunk portion, a first set of wires, a first electrical connector supported by a first housing, and a first plurality of light-emitting diodes (LEDs), the first electrical connector, the first housing and the first set of wires positioned at least partially within a cavity of the first trunk portion, the first set of wires in electrical connection with the power-conditioning circuitry, with the first electrical connector and with the first plurality of LEDs, the first electrical connector having a first electrical terminal and a second electrical terminal, the first and the second electrical terminals being coaxial and at least a portion of the first electrical connector projecting outwardly and away from the first housing into a space formed within a hollow end of the first trunk portion, such that neither of the first or the second electrical terminals are in direct contact with the hollow end of the first trunk portion; and
   a second tree portion including a second trunk portion, a second set of wires, a second electrical connector, and a second plurality of LEDs, the second electrical connector and the second set of wires positioned at least partially within a cavity of the second trunk portion, the second set of wires in electrical connection with the second electrical connector and with the second plurality of LEDs, the second electrical connector supported by a housing portion, and having a first electrical terminal and a second electrical terminal;
   wherein the second tree portion is configured to couple to the first tree portion such that the first electrical connector of the first tree portion is in electrical connection with the second electrical connector of the second tree portion, thereby causing the first set of wires to be in electrical connection with the second set of wires.

2. The artificial lighted tree of claim 1, further comprising electronic components configured to cause power to at least some of the first or the second plurality of LEDs to be selectively powered on and off, while others of the first or the second plurality of LEDs are powered on.

3. The artificial lighted tree of claim 1, wherein the first and the second electrical terminals of the second electrical connector are coaxial.

4. The artificial lighted tree of claim 1, wherein the input power comprises an alternating-current power, and the output power comprises a direct-current power.

5. The artificial lighted tree of claim 1, wherein each of the first and the second electrical connectors includes more than two electrical terminals, but not more than eight electrical terminals.

6. The artificial lighted tree of claim 5, wherein each of the first and the second electrical connectors includes four electrical terminals.

7. The artificial lighted tree of claim 6, wherein each of the first electrical connector and the second electrical connector transmits a first power having a first voltage and a second power having a second voltage, the first voltage being greater than the second voltage.

8. An artificial lighted tree, comprising:
power-conditioning circuitry configured to receive an input power and output a first output power;
control electronics in electrical connection with the power-conditioning circuitry;
a first tree portion including a first trunk portion, a first set of wires having four wires, a first electrical connector supported by a first housing, and a first plurality of light-emitting diodes (LEDs), the first electrical connector and the first set of wires positioned at least partially within a cavity of the first trunk portion, the first set of wires in electrical connection with the power-conditioning circuitry, the first electrical connector and the first plurality of LEDs, the first electrical connector having four electrical terminals, each of the four electrical terminals corresponding to one of the four wires of the first set of wires; and
a second tree portion including a second trunk portion, a second set of wires including four wires, a second electrical connector supported by a second housing, and a second plurality of LEDs, the second electrical connector and the second set of wires positioned at least partially within a cavity of the second trunk portion, the second set of wires in electrical connection with the second electrical connector and the second plurality of LEDs, the second trunk connector having four electrical terminals, each of the four electrical terminals corresponding to one of the four wires of the second set of wires;
wherein the control electronics are configured to selectively control power to the four terminals of the first electrical connector of the first tree portion, and the second tree portion is configured to couple to the first tree portion such that the four electrical terminals of the first electrical connector of the first tree portion are in electrical connection with the four electrical terminals of the second electrical connector of the second tree portion, thereby electrically connecting the first set of wires to the second set of wires.

9. The artificial lighted tree of claim 8, wherein a first and a second electrical terminal of the first electrical connector are coaxial.

10. The artificial lighted tree of claim 8, wherein at least a portion of the first electrical connector projects outwardly and away from the first housing into a space formed within a hollow end of the first trunk portion, such that neither of a first or a second electrical terminal of the first electrical connector are in direct contact with the hollow end of the first trunk portion.

11. The artificial lighted tree of claim 8, wherein the input power comprises an alternating-current power, and the output power comprises a direct-current power.

12. The artificial lighted tree of claim 8, wherein each of the first electrical connector and the second electrical connector transmits a first power having a first voltage and a second power having a second voltage, the first voltage being greater than the second voltage.

13. A tree-trunk power system for a lighted artificial tree, comprising:
a first generally-cylindrical trunk portion having a first end and a second end, a power cord including a pair of transmission wires and a power plug, the pair of transmission wires having a first end and a second end, the power plug connected to the pair of transmission wires at the first end, the second end of the pair of transmission wires inserted through an opening of the first generally-cylindrical trunk portion and positioned inside a cavity of the first generally-cylindrical trunk portion;
a plurality of wires insertable into the cavity of the first generally-cylindrical trunk portion and having a first end and a second end, the second end of the plurality of wires in electrical connection with the second end of the pair of transmission wires within the cavity of the first generally-cylindrical trunk portion;
a trunk plug assembly including an electrical connector, a housing supporting the electrical connector, the housing being insertable into the second end of the first generally-cylindrical trunk portion and connectable to the first end of the plurality of wires;
wherein a length of the plurality of wires is sufficiently long enough to allow the trunk plug assembly to be connected to the plurality of wires outside of the cavity of the first generally-cylindrical trunk portion prior to the housing of the trunk plug assembly being inserted into the second end of the first generally-cylindrical trunk portion.

14. The tree-trunk power system of claim 13, wherein the housing is configured such that a gap is formed between a portion of the housing and an inside surface of the first generally-cylindrical trunk portion when the housing is inserted into the first generally-cylindrical trunk portion.

15. The tree-trunk power system of claim 13, further comprising power conditioning circuitry in electrical connection with the pair of transmission wires and the plurality of wires.

16. The tree-trunk power system of claim 13, wherein the trunk plug assembly further includes a male or a female connector for connecting to the first end of the plurality of wires.

17. The tree-trunk power system of claim 13, wherein the electrical connector comprises two electrical terminals.

18. The tree-trunk power system of claim 17, wherein the two electrical terminals are coaxial.

19. The tree-trunk power system of claim 17, wherein at least a portion of the first electrical connector projects outwardly and away from the housing into a space formed within a hollow end of the first trunk portion, such that neither of the two electrical terminals are in direct contact with a hollow end of the first trunk portion.

* * * * *